(12) United States Patent
Hedayati et al.

(10) Patent No.: US 9,692,470 B2
(45) Date of Patent: Jun. 27, 2017

(54) LOW NOISE AMPLIFIER AND NOTCH FILTER

(71) Applicant: QUALCOMM Incorporated, San Diego, CA (US)

(72) Inventors: Hajir Hedayati, San Diego, CA (US); Milad Darvishi, San Diego, CA (US); Li-Chung Chang, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/835,569

(22) Filed: Aug. 25, 2015

(65) Prior Publication Data

US 2017/0063414 A1 Mar. 2, 2017

(51) Int. Cl.
*H04B 1/10* (2006.01)
*H04B 1/16* (2006.01)
*H03F 3/19* (2006.01)
*H03F 3/21* (2006.01)
*H04B 1/525* (2015.01)

(52) U.S. Cl.
CPC .......... *H04B 1/16* (2013.01); *H03F 3/19* (2013.01); *H03F 3/211* (2013.01); *H04B 1/109* (2013.01); *H04B 1/525* (2013.01); *H03F 2200/294* (2013.01); *H03F 2200/451* (2013.01); *H03F 2203/21106* (2013.01); *H04B 2001/1063* (2013.01)

(58) Field of Classification Search
CPC .. H04B 1/2007; H04B 1/0475; H04B 1/1036; H04B 2001/1063
USPC ............ 455/226.1, 339, 213, 307, 296
See application file for complete search history.

(56) References Cited

U.S. PATENT DOCUMENTS

| | | | |
|---|---|---|---|
| 3,369,189 A | 2/1968 | Hoffman et al. | |
| 7,312,738 B2* | 12/2007 | Koe | H03M 3/344 341/143 |
| 7,894,779 B2* | 2/2011 | Meiyappan | H04B 1/1036 455/83 |
| 8,005,448 B1* | 8/2011 | Yan | H03H 7/465 455/121 |
| 8,036,623 B2* | 10/2011 | Chang | H04B 1/525 455/296 |
| 8,526,903 B2* | 9/2013 | Gudem | H04B 1/525 455/296 |
| 8,855,593 B2 | 10/2014 | Mirzaei et al. | |
| 9,112,476 B2* | 8/2015 | Basaran | H03H 7/12 |

(Continued)

FOREIGN PATENT DOCUMENTS

WO 2006068635 A1 6/2006

OTHER PUBLICATIONS

Hedayati, Hajir et al., "A 1.8 dB NF Blocker-Filtering Noise-Canceling Wideband Receiver With Shared TIA in 40 nm CMOS," IEEE Journal of Solid-State Circuits, May 2015, vol. 50, No. 5, pp. 1148-1164.

(Continued)

*Primary Examiner* — Sonny Trinh
(74) *Attorney, Agent, or Firm* — Qualcomm Incorporated-Toler

(57) ABSTRACT

An apparatus includes a low noise amplifier (LNA) having an input configured to receive a radio frequency signal. The apparatus also includes a notch filter coupled to an input of the LNA. The notch filter is configured to attenuate the radio frequency signal at a notch frequency.

21 Claims, 10 Drawing Sheets

(56) References Cited

U.S. PATENT DOCUMENTS

| | | | |
|---|---|---|---|
| 9,118,396 B2 * | 8/2015 | Gudem | H04B 1/3805 |
| 9,413,326 B2 * | 8/2016 | Basaran | H03H 7/12 |
| 2010/0317311 A1 | 12/2010 | Mirzaei et al. | |
| 2012/0322395 A1 | 12/2012 | McCullagh | |
| 2014/0220908 A1 | 8/2014 | Loh | |
| 2014/0329484 A1 | 11/2014 | Lau et al. | |
| 2015/0063509 A1 | 3/2015 | Hedayati et al. | |

OTHER PUBLICATIONS

Khatri, Himanshu et al., "An Active Transmitter Leakage Suppression Technique for CMOS SAW-Less CDMA Receivers," IEEE Journal of Solid-State Circuits, Aug. 2010, vol. 45, No. 8, pp. 1590-1601.

International Search Report and Written Opinion—PCT/US2016/043890—ISA/EPO—Oct. 26, 2016, 13 pages.

* cited by examiner

LOW NOISE AMPLIFIER AND NOTCH FILTER

I. FIELD

The present disclosure is generally related to electronics, and more specifically to wireless communication devices.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities and may support increasing wireless communication capability, particularly in downlink communications that provide information to the wireless telephones.

In wireless telephones that can simultaneously transmit and receive wireless communications, transmit (Tx) leakage can impose a performance limitation on receive (Rx) circuitry. Tx leakage and other jammers in the Rx circuitry can be modulated and down-converted to baseband along with a received wireless signal. Tx leakage and jammers may have a relatively large voltage swing as compared to the received signal and may saturate an output of a receiver that converts the received signal from radio-frequency (RF) to baseband.

In carrier aggregation (CA) architectures, blockers (TX leakage and jammers) are a performance limitation of Rx circuitry. For intra-CA operation where a low noise amplifier (LNA) is followed by a cascode device or a transconductance stage, the LNA output is a high impedance node. The high impedance causes large blocker swing and linearity issues. For concurrent CA operation, the noise figure in one CA receive path may be degraded if a signal in another CA receive path is larger and acts as a jammer.

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
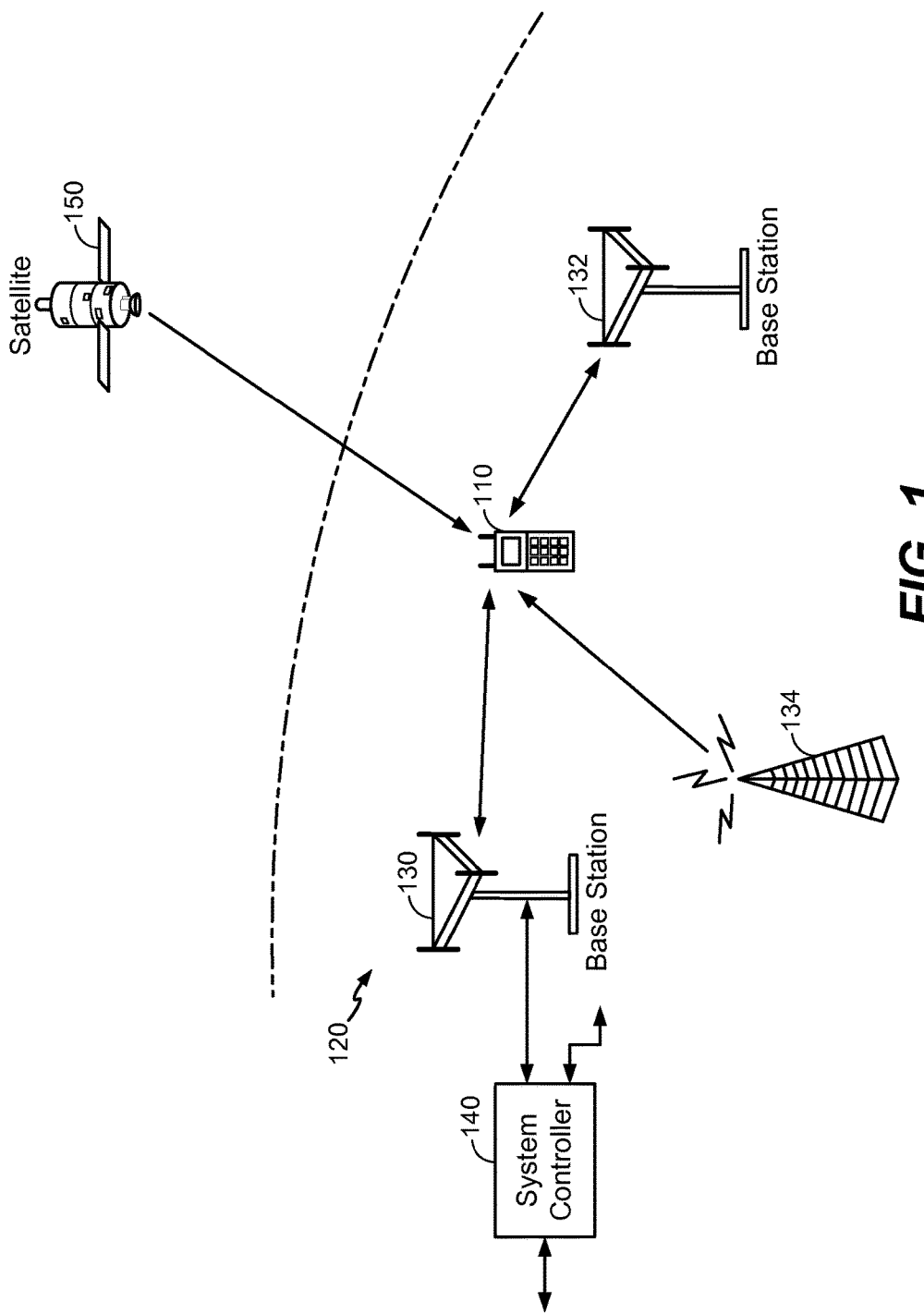
FIG. 1 shows a wireless device that includes a notch filter coupled to an input of an LNA, the wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Furthermore, in an exemplary embodiment, the wireless device 110 includes a notch filter coupled to an input of an LNA. A radio frequency (RF) signal may be received at an antenna of the wireless device and amplified by an LNA in an LNA block to generate an amplified signal. The amplified signal may include "desired" signal components corresponding to one or more carrier frequencies of a receive signal and may also include "non-desired" signal components. Examples of non-desired signal components include "jammers" (e.g., another received signal at a frequency close to the carrier frequency) and "transmitter leakage" caused by a transmitter within the wireless device 110. For example, the wireless device 110 may wirelessly transmit first signals while receiving second signals from one or more of the base stations 130, 132 and receiving third signals from the broadcast stations. Transmission of the first signals may introduce transmitter leakage noise into the received second signals, and the received third signals may interfere with the received second signals as jammers.

The notch filter may attenuate the non-desired components of the amplified signal at one or more notch frequencies by providing a low impedance at the notch frequencies while providing a high impedance at the desired carrier frequencies to generate a filtered signal. For example, the notch filter may have a notch frequency at a transmitter local oscillator (Tx LO) frequency of the wireless device 110. The notch filter may include a feedback stage that may provide improved filter performance by enhancing the attenuation at the notch frequency. The filtered signal may be further amplified by one or more LNAs within the LNA block and provided to a receiver in the wireless device 110 for downconversion and further processing, as described in further detail with respect to FIG. 2.

Figure 2:
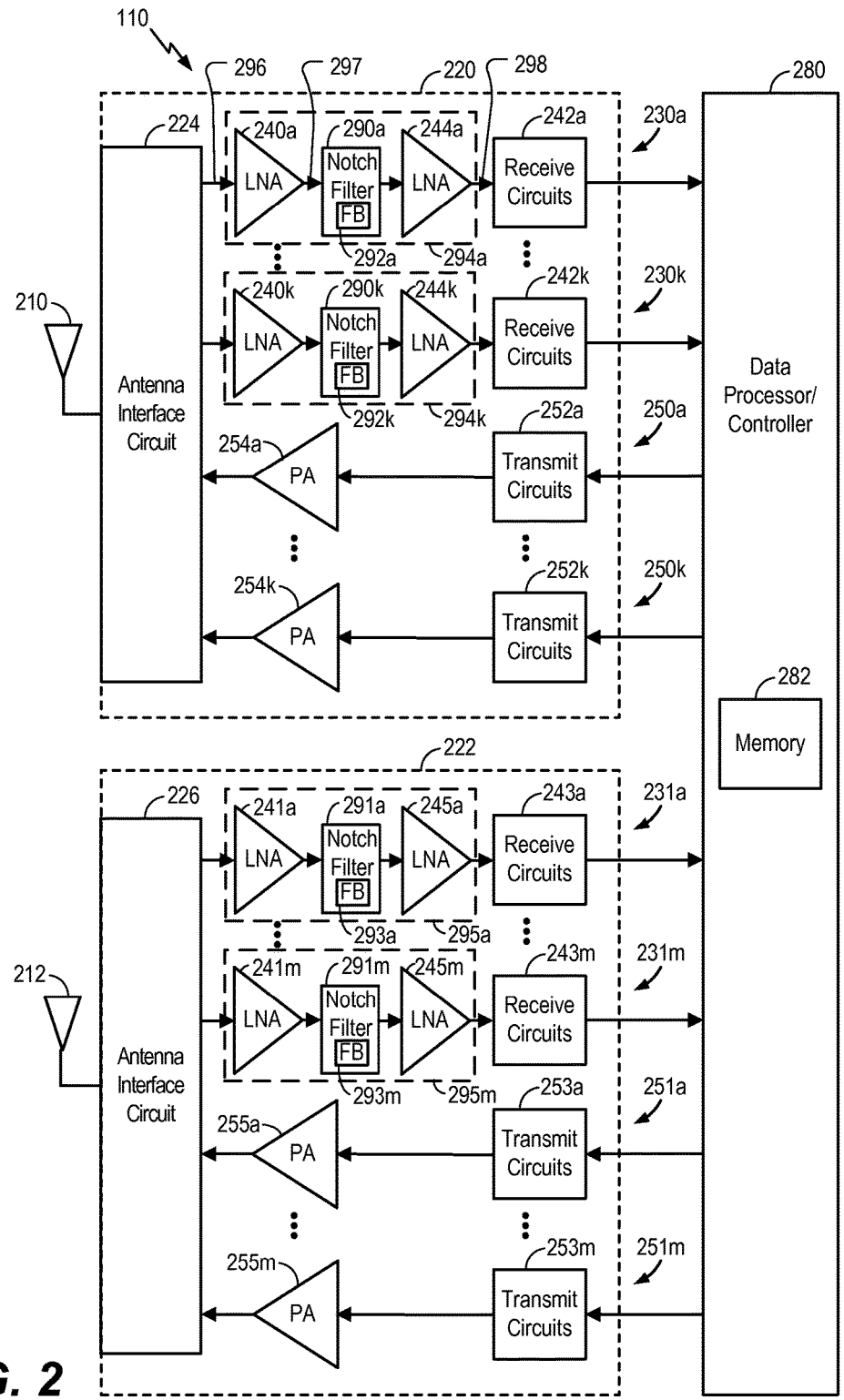
FIG. 2 shows a block diagram of the wireless device in FIG. 1 that includes a notch filter coupled to an input of an LNA.

FIG. 2 shows a block diagram of an exemplary design of wireless device 110 in FIG. 1. In this exemplary design, wireless device 110 includes a transceiver 220 coupled to a primary antenna 210 via an antenna interface circuit 224, a transceiver 222 coupled to a secondary antenna 212 via an antenna interface circuit 226, and a data processor/controller 280. Transceiver 220 includes multiple (K) receivers 230a to 230k and multiple (K) transmitters 250a to 250k to support multiple frequency bands, multiple radio technologies, carrier aggregation, etc. Transceiver 222 includes multiple (L) receivers 231a to 231m and multiple (L) transmitters 251a to 251m to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230a to 230k and 231a to 231m includes one of the LNA blocks 294a to 294k or 295a to 295m and one of the receive circuits 242a to 242k or 243a to 243m. Each LNA block 294a to 294k and 295a to 295m may include one of the LNAs 240a to 240k or 241a to 241m that is configured to provide an RF signal to one of the notch filters 290a to 290k or 291a to 291m. Each LNA block 294a to 294k and 295a to 295m also includes one of LNAs 244a to 244k or 245a to 245m. Each of the notch filters 290a to 290k and 291a to 291m includes a feedback stage 292a to 292k and 293a to 293m and is configured to attenuate components of a received signal at a notch frequency. In other implementations, one or more (or all) of the notch filters 290a to 290k and 291a to 291m do not include a feedback stage.

For data reception, antenna 210 receives signals from base stations and/or other transmitter stations and provides a received RF signal, which is routed through the antenna interface circuit 224. Antenna interface circuit 224 may include switches, duplexers, transmit filters, receive filters, matching circuits, etc. An output of the antenna interface circuit 224 is presented as an input RF signal to one or more of the receivers 230a to 230k and 231a to 231m, such as via a first input signal path to receiver 230a or via a second input signal path to receiver 230k. Within the one or more of the receivers 230a to 230k and 231a to 231m, the input RF signal is amplified and filtered in the respective one or more LNA blocks 294a to 294k and 295a to 295m and provided to the respective one or more receive circuits 242a to 242k and 243a to 243m, as described below.

The description below assumes that receiver 230a is selected to receive an RF signal 296. The RF signal is received from the antenna 210 via the antenna interface circuit 224 and is provided to the LNA 240a in the LNA block 294a. An amplified RF signal 297 is generated by the LNA 240a, filtered by the notch filter 290a, and input to the LNA 244a. Receive circuits 242a downconvert the filtered amplified RF signal 298 that is output by the LNA 244a from RF to baseband, amplify and filter the downconverted signal, and provide an analog input signal to data processor/controller 280. Receive circuits 242a may include mixers, filters, amplifiers, matching circuits, an oscillator, a local oscillator (LO) generator, a phase locked loop (PLL), etc. Each of the receivers 230a to 230k and 231a to 231m in transceivers 220 and 222 may operate in a similar manner as receiver 230a.

In the exemplary design shown in FIG. 2, each of the transmitters 250a to 250k and 251a to 251m includes one of the transmit circuits 252a to 252k and 253a to 253m and one of the power amplifiers (PAs) 254a to 254k and 255a to 255m. For data transmission, data processor/controller 280 processes (e.g., encodes and modulates) data to be transmitted and provides an analog output signal to a selected transmitter. The description below assumes that transmitter 250a is the selected transmitter to transmit a RF signal. Within transmitter 250a, transmit circuits 252a amplify, filter, and upconvert the analog output signal from baseband to RF and provide a modulated RF signal. Transmit circuits 252a may include amplifiers, filters, mixers, matching circuits, an oscillator, an LO generator, a PLL, etc. A PA 254a receives and amplifies the modulated RF signal and provides a transmit RF signal having the proper output power level. The transmit RF signal is routed through antenna interface circuit 224 and transmitted via antenna 210. Each of the transmitters 250a to 250k and 251a to 251m in transceivers 220 and 222 may operate in a similar manner as transmitter 250a.

FIG. 2 shows an exemplary design of receivers 230a to 230k and 231a to 231m and transmitters 250a to 250k and 251a to 251m. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNA blocks 294a to 294k and 295a to 295m and receive circuits 242a to 242k and 243a to 243m may be implemented on one module, which may be an RFIC, etc.

Data processor/controller 280 may perform various functions for wireless device 110. For example, data processor/controller 280 may perform processing for data being received via receivers 230a to 230k and 231a to 231m and data being transmitted via transmitters 250a to 250k and 251a to 251m. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs (e.g., the LNAs in the LNA blocks 294a to 294k and 295a to 295m) to support reception via the multiple band groups, multiple radio technologies, and/or multiple antennas. Exemplary embodiments of components that may be used in the wireless device 110 are described in further detail with respect to FIGS. 3-9.

Figure 3:
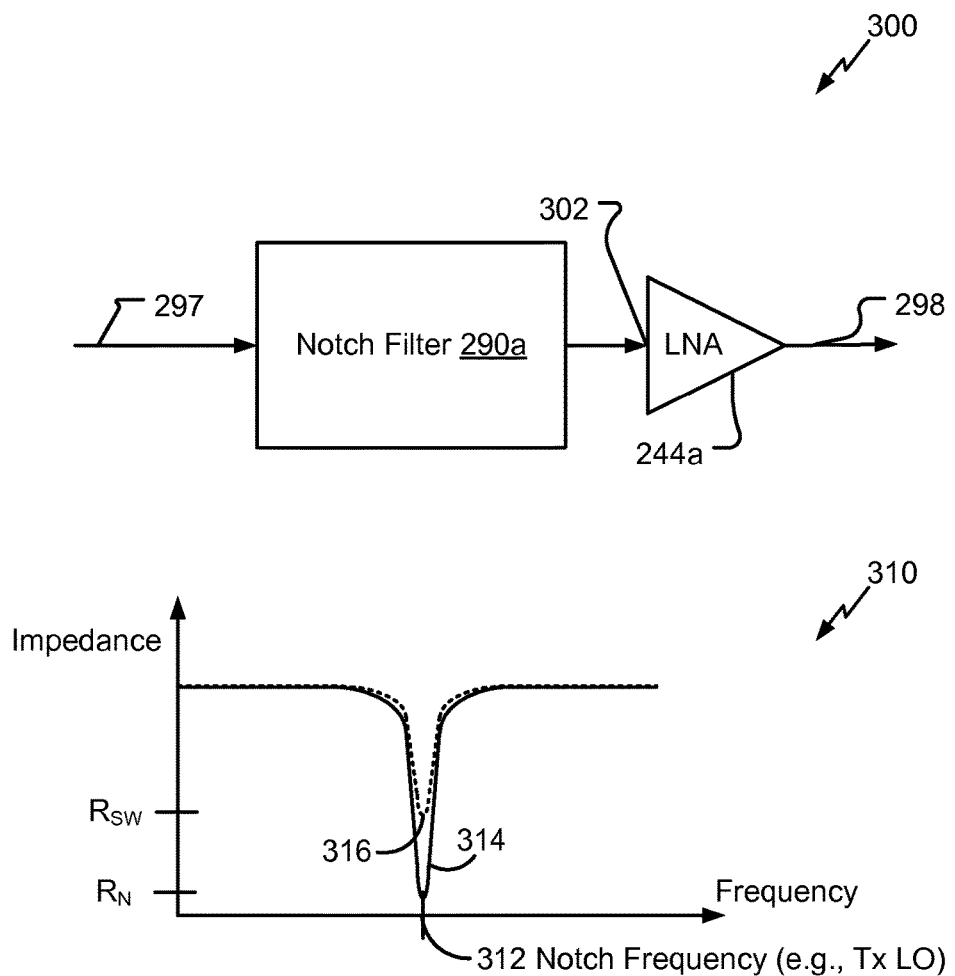
FIG. 3 shows a block diagram of an exemplary embodiment of components including a notch filter coupled to an input of an LNA that may be included in the wireless device of FIG. 1.

FIG. 3 illustrates an exemplary embodiment 300 of components that may be included in the wireless device 110 and a graph 310 that illustrates an impedance characteristic of the notch filter 290a of FIG. 2. The notch filter 290a may be configured to receive the RF signal 297 from the antenna 210 of FIG. 2 via the antenna interface circuit 224 and to generate a filtered RF signal that is received at an input 302 of the LNA 244a. The LNA 244a may be configured to generate the filtered amplified RF signal 298. The filtered amplified RF signal 298 may be provided to the receiver circuits 242a of FIG. 2. Although the notch filter 290a and the LNA 244a are depicted, in an exemplary embodiment each of the notch filters 290a to 290k and 291a to 291m and LNAs 244a to 244k and 245a to 245m operates in a similar manner as described with respect to the notch filter 290a and the LNA 244a.

As illustrated in the graph 310, the notch filter 290a is configured to provide an approximately constant impedance across a frequency range and may provide a lower-impedance "notch" 314 having impedance $R_N$ at a notch frequency 312. For example, the notch frequency 312 may correspond to a frequency of a transmitter local oscillator in the wireless device 110 (e.g., a carrier frequency used by the transmitter 251a of FIG. 2 while the RF signal 296 is received at the receiver 230a). The notch filter 290a may be coupled to a relatively high impedance node of the LNA block 294a, such as between the output of the LNA 240a and the input 302 of the LNA 244a, as described in further detail with respect to FIG. 4. The reduced impedance at the notch frequency 312 attenuates components of the RF signal 297 corresponding to the notch frequency 312. For example, components of the RF signal 297 having the notch frequency 312 may be attenuated by following the lower-impedance path to ground while other components of the RF signal 297 do not encounter the lower-impedance path (because the notch filter 290a is frequency-specific).

In an exemplary embodiment in which the notch filter 290a includes the feedback stage 292a, the feedback stage 292a is configured to provide reduced impedance at the notch frequency 312 as compared to an implementation where the notch filter 290a does not include the feedback stage 292a. For example, an implementation of the notch filter 290a with the feedback stage 292a may produce a notch 314 that has a lower impedance $R_N$ than the impedance $R_{SW}$ at the notch 316 and may therefore provide more attenuation of undesired signal components at the notch frequency 312 than in the exemplary embodiment depicted in FIG. 3 (note that the graph 310 is not necessarily to scale). As an illustrative, non-limiting example, the notch filter 290a including the feedback stage 292a may provide an approximately 19 decibel (dB) attenuation at the notch frequency 312 while the notch filter 290a without the feedback stage 292a may provide an approximately 9 dB attenuation at the notch frequency 312. An example of components that may be included in the notch filter 290a is described in further detail with respect to FIGS. 4-5.

Figure 4:
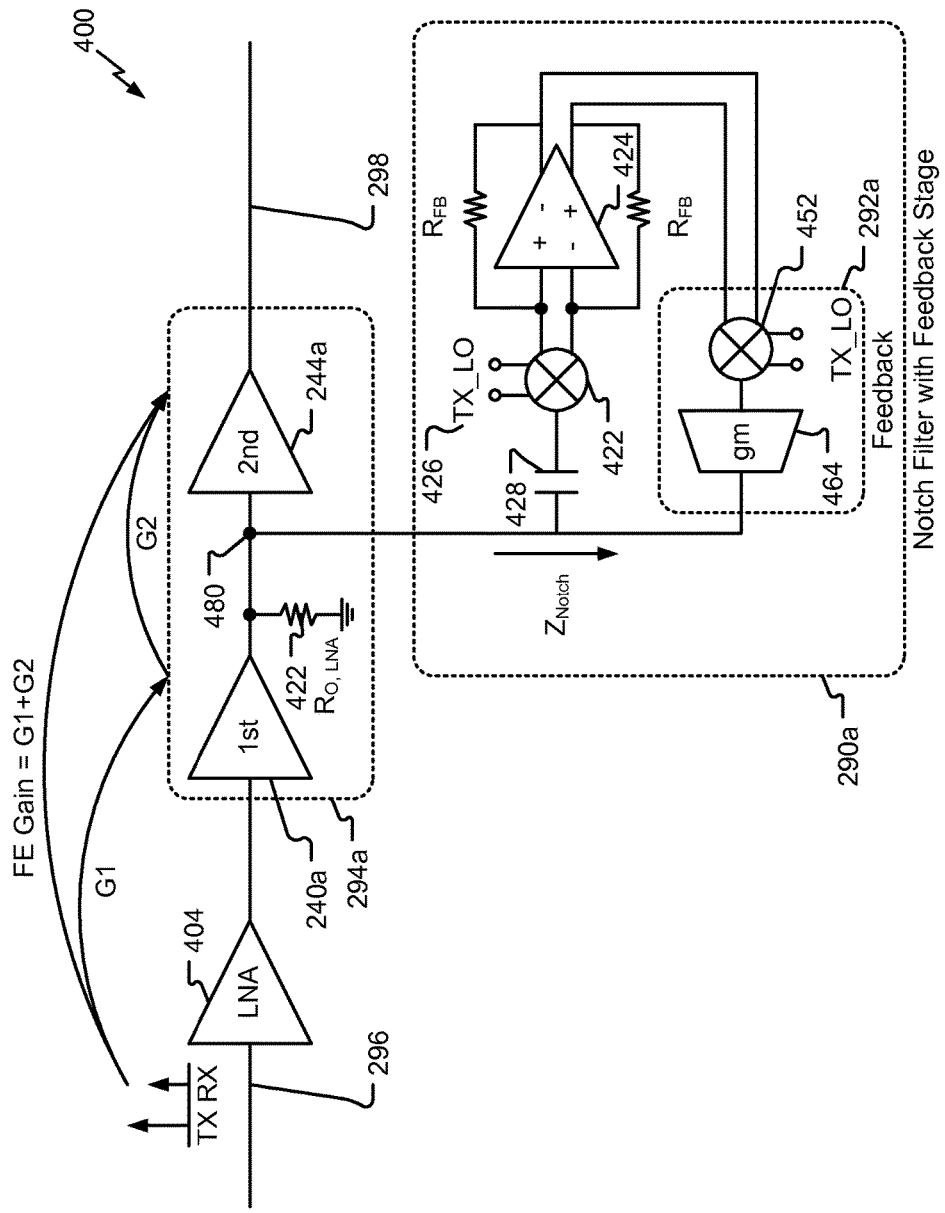
FIG. 4 shows a block diagram of another exemplary embodiment of components including a notch filter coupled to an input of an LNA that may be included in the wireless device of FIG. 1.

FIG. 4 illustrates an exemplary embodiment 400 of a portion of a receiver path of the wireless device 110 of FIG. 1 that includes the LNA block 294a with the notch filter 290a. The RF signal 296 of FIG. 2 may be received at an input of an LNA 404 (e.g., a LNA that precedes the LNA block 294a in FIG. 2), and an output of the LNA 404 is coupled to an input of a first LNA 240a in the LNA block 294a. The output of the first LNA 240a is coupled to a node (e.g., a high-impedance node) 480, and an input of a second LNA 244a in the LNA block 294a is coupled to the node 480. The notch filter 290a is coupled to the output of the first LNA 240a at the node 480 and is configured to attenuate a signal component at a notch frequency. The amplified filtered RF signal 298 of FIG. 2 may be output by the LNA block 294a.

The notch frequency (e.g., the notch frequency 312 of FIG. 3) may correspond to a transmit frequency (TX) of a transmitter of the wireless device 110 (e.g., the transmitter 250a) to suppress TX leakage. Alternatively, the notch frequency may correspond to another frequency to suppress a blocker in that frequency. As illustrated, the RF signal 296 may include a component at a receive frequency (RX) and another component due to transmitter leakage at the transmit frequency (TX). A front-end (FE) gain applied to the RF signal 296 may equal the combined gain (G1) of the LNA 404 and the first LNA 240a added to the gain (G2) applied by the second LNA 244a. Filtering the TX leakage or a blocker with the notch filter 290a reduces the magnitude of the TX leakage or the blocker component, enabling greater sensitivity of the receiver 230a and increased front-end gain (e.g., G2 may increase due to the TX component being reduced or removed).

The notch filter 290a provides a relatively low impedance path to attenuate blocker components having the blocker frequency. In some implementations, the TX leakage is the main blocker and the frequency of the notch filter 290a is set to TX leakage. In other implementations, the notch frequency may be another frequency, such as a blocker frequency. In some implementations where multiple notch filters 290a are coupled to the output of the first LNA 240a, multiple notch frequencies may be used (e.g., TX and one or more blocker frequencies), such as described in further detail with respect to FIGS. 7-9.

As illustrated, the notch filter 290a is a single-port filter that is coupled to the node 480, such as a high-impedance node, in the LNA block 294a. The notch filter 290a is configured to provide a low impedance (e.g., a low-impedance path to ground) at the notch frequency. An input of the notch filter 290a may be capacitively coupled to the node 480 via a capacitor 428 to decouple the DC operation points of the LNA block 294a and the notch filter 290a.

The notch filter 290a may include a mixer 422 having a first single-ended input coupled to the output of the first LNA 240a via the node 480 and having a second differential input configured to receive a transmit local oscillator signal (Tx LO) 426. For example, Tx LO 426 may be a differential local oscillator signal to be applied to the notch filter 290a to create a notch at a transmitter frequency, such as a transmitter frequency of the transmit circuits 252a of FIG. 2. The mixer 422 provides a differential output that is coupled to inputs of an operational amplifier 424, such as an operational transconductance amplifier (OTA). When the operational amplifier 424 is configured to introduce no gain at the received band frequency (e.g., a unity gain), the notch filter 290a does not degrade (or has little impact on) the noise figure of the receive path. The notch filter 290a may provide rejection of blocker components of at least 10 dB at the notch frequency with relatively small additional circuit area and power consumption.

The feedback stage 292a provides enhanced rejection at the notch frequency. The feedback stage 292a includes a second mixer 452 coupled to a transconductance device 464. The second mixer 452 has a first set of mixer inputs coupled to receive the Tx LO 426 and has a second set of mixer inputs coupled to outputs of the operational amplifier 424.

Figure 5:
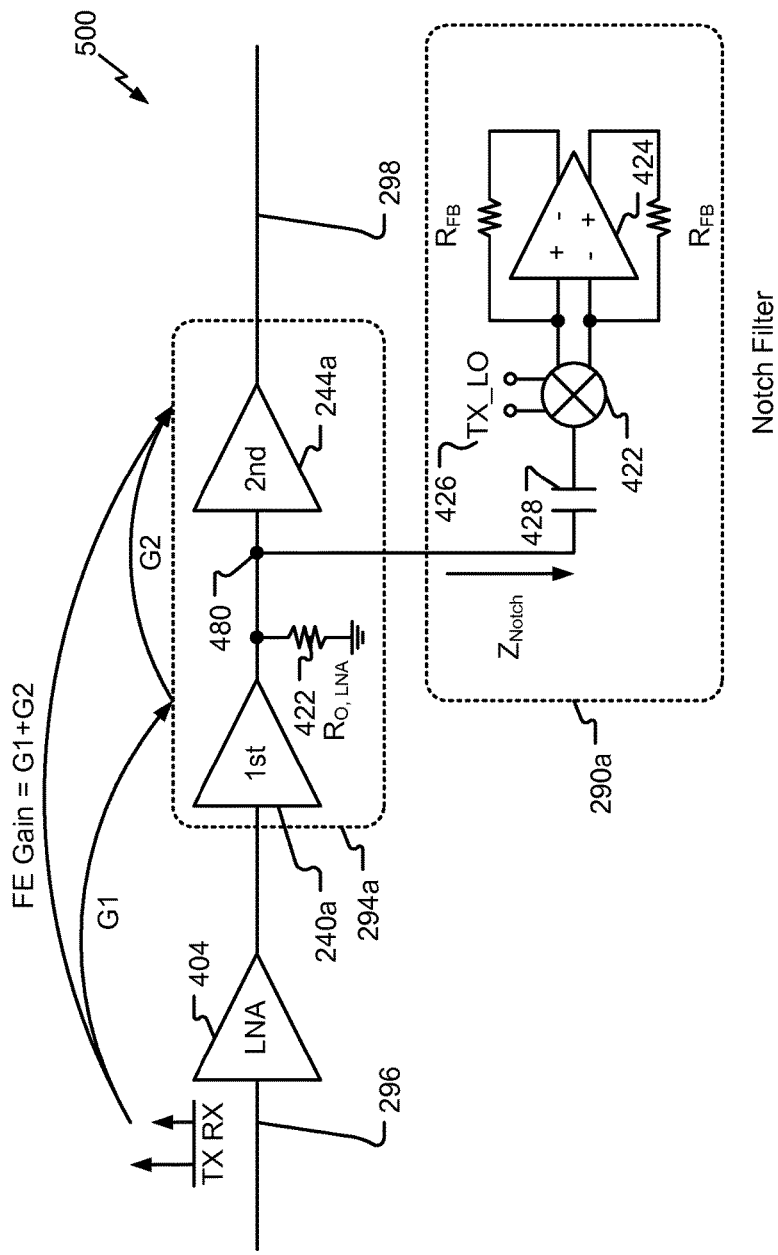
FIG. 5 shows a block diagram of another exemplary embodiment of components including a notch filter coupled to an input of an LNA that may be included in the wireless device of FIG. 1.

An output of the second mixer 452 is coupled to an input of the transconductance device 464 (e.g., a metal-oxide-semiconductor (MOS) transistor). The output of the transconductance device 464 is coupled to the output of the first LNA 240a at the node 480 (e.g., a high-impedance node). The transconductance device 464 may serve as an isolation block with low noise injection into the receive path. The notch filter 290a may exhibit enhanced performance when the Tx LO signals that drive the mixer 422 are non-overlapping with the TX LO signals that drive the second mixer 452 as compared to filter performance when the Tx LO signals that drive the mixer 422 overlap with the TX LO signals that drive the second mixer 452. In some implementations, the LO signals that drive the mixer 422 and the second mixer 452 are in-phase and quadrature (IQ) LO signals. Although FIG. 4 depicts a single balanced architecture, in other implementations the notch filter 290a may include a double balanced architecture. Although FIG. 4 depicts the notch filter 290a as including the feedback stage 292a, in other implementations the notch filter 290a may not include the feedback stage 292a (e.g., the outputs of the operational amplifier 424 may be coupled to the inputs of the operational amplifier 424 via feedback resistors without also being routed to other circuit components, such as depicted in FIG. 5).

In an exemplary embodiment, the notch filter 290a including the feedback stage 292a may have a 19 dB rejection at the notch frequency. As an illustrative, non-limiting example, the feedback stage 292a may provide a 9 dB rejection improvement as compared to implementation of the notch filter 290a that omits the feedback stage 292a. To illustrate, a resistance at the notch frequency of the notch filter 290a without the feedback stage 292a may be approximately equal to $R_{SW}+\alpha R_{FB}/A(\omega_{RX}-\omega_{TX})$, where $R_{SW}$ is the mixer switch resistance and $R_{FB}$ represents the resistance of the feedback resistors coupled between the inputs and the outputs of the operational amplifier 424, A(s) represents the gain of the operational amplifier 424 at the frequency s, $\omega_{RX}$ represents a frequency of a receiver carrier signal, and $\omega_{TX}$ represents the notch frequency. This resistance can be approximated by $R_{SW}$.

The feedback stage 292a reduces the resistance of the notch filter 290a at the notch frequency to a value $R_N$ that may be expressed as $R_{SW}/(LoopGain)$, where $$LoopGain = g_m \times \frac{1}{2\pi^2} \times \frac{R_{O,LNA}}{R_{SW}+R_{O,LNA}} \times R_{FB}. \quad \text{(Equation 1)}$$

In Equation 1, $g_m$ indicates the transconductance of the transconductance device 464, and $R_{O,LNA}$ represents the output impedance 422 of the first LNA 240a. Because LoopGain has a value greater than one, the resistance ($R_N$) at the notch when the notch filter 290a includes the feedback stage 292a is lower than the resistance ($R_{SW}$) at the notch of an implementation of the notch filter 290a without the feedback stage 292a. Reducing the resistance at the notch frequency 312 increases attenuation of components of a signal at notch frequency 312. In addition, multiple notch filters may be used to provide multiple notches at different frequencies, as described with respect to FIG. 7-9.

Since the notch filter functions as a one-port load for the LNA stage, the notch filter provides a low impedance at a blocker frequency to suppress the blocker. Therefore, the rejection of the notch filter is dependent on the output impedance presented by the LNA stage ($R_{O,LNA}$). The larger $R_{O,LNA}$, the larger the rejection at the notch frequency. By adding the feedback stage, the impedance presented by the notch filter is further reduced, and therefore the notch filter provides enhanced attenuation of the blocker at the notch frequency even if $R_{O,LNA}$ is not large.

FIG. 5 illustrates an exemplary embodiment 500 of a portion of a receiver path of the wireless device 110 of FIG. 1 that includes an implementation of the notch filter 290a that omits the feedback stage 292a of FIG. 2. The RF signal 296 of FIG. 2 may be received at an input of the LNA 404 of FIG. 4, and an output of the LNA 404 is coupled to an input of a first LNA 240a in the LNA block 294a. The output of the first LNA 240a is coupled to the node 480, and an input of the second LNA 244a is coupled to the node 480. The notch filter 290a is coupled to the output of the first LNA 240a at the node 480 and is configured to attenuate a signal component at a notch frequency. The amplified filtered RF signal 298 may be output by the LNA block 294a.

As illustrated, the notch filter 290a is a single-port filter that is coupled to the node 480, such as a high-impedance node, in the LNA block 294a. The notch filter 290a is configured to provide a low impedance (e.g., a low-impedance path to ground) at the notch frequency. An input of the notch filter 290a may be capacitively coupled to the node 480 via the capacitor 428 to decouple the DC operation points of the LNA block 294a and the notch filter 290a.

The notch filter 290a may include the mixer 422 having a first single-ended input coupled to the output of the first LNA 240a via the node 480 and having a second differential input configured to receive the transmit local oscillator signal (Tx LO) 426. The mixer 422 provides a differential output that is coupled to inputs of the operational amplifier 424. When the operational amplifier 424 is configured to introduce no gain at the received band frequency (e.g., a unity gain), the notch filter 290a does not degrade (or has little impact on) the noise figure of the receive path. In the exemplary embodiment of FIG. 5, the notch filter 290a may provide rejection of blocker components of at least 10 dB at the notch frequency with smaller circuit area and power consumption as compared to the exemplary embodiment of FIG. 4 that includes the feedback stage 292a.

Figure 6:
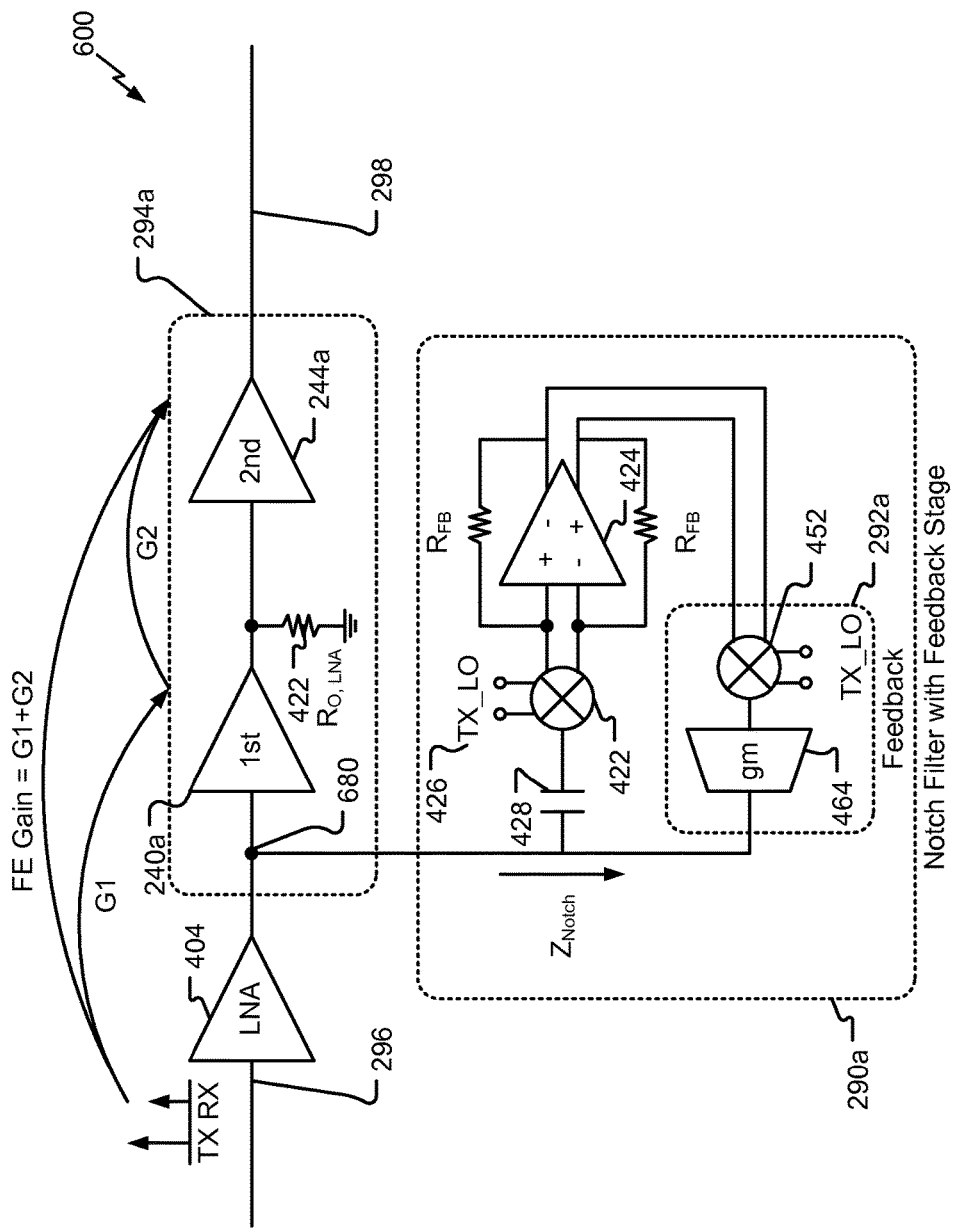
FIG. 6 shows a block diagram of another exemplary embodiment of components including a notch filter coupled to an input of an LNA that may be included in the wireless device of FIG. 1.

Although FIGS. 2, 4, and 5 illustrate the notch filter 290a in the LNA block 294a and coupled to the output of the first LNA 240a, in other implementations the notch filter 290a may instead be coupled to other nodes within the LNA block 294a. FIG. 6 depicts an exemplary embodiment 600 where the notch filter 290a of FIG. 4 is coupled to a node 680 at the input of the first LNA 240a (e.g., at the output of the LNA 404). For example, even though the output of the LNA 404 may present a lower impedance to the notch filter 290a than the output of the first LNA 240a, the reduced impedance of the notch filter 290a at the notch frequency may be sufficiently small (e.g., due to the feedback stage 292a) to enable blocker filtering when the notch filter 290a is coupled to the output of the LNA 404.

Figure 7:
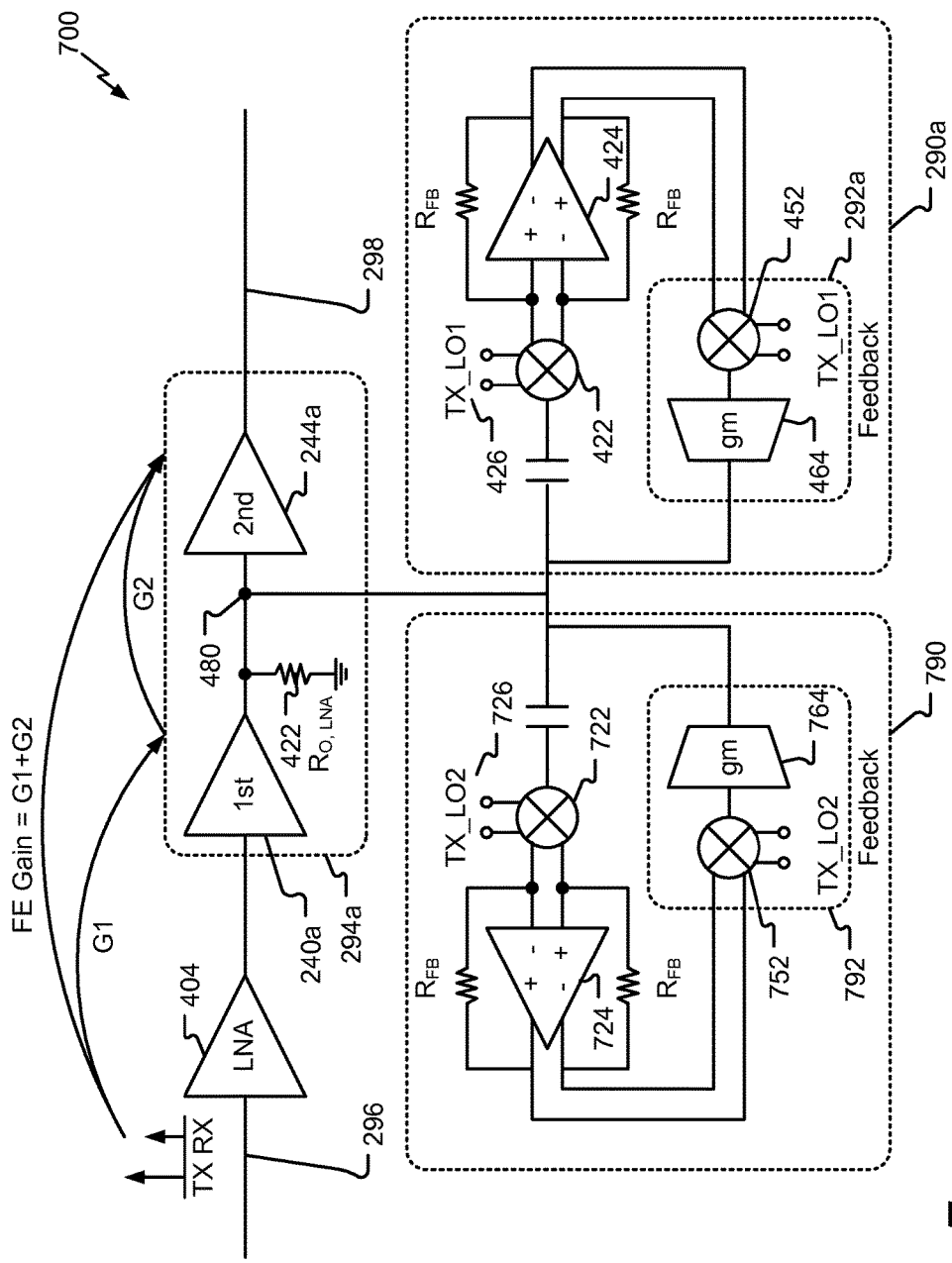
FIG. 7 shows a block diagram of another exemplary embodiment of components including multiple notch filters that may be included in the wireless device of FIG. 1.

An exemplary embodiment 700 of the LNA block 294a including multiple notch filters is illustrated in FIG. 7. The notch filter 290a having the first feedback stage 292a and a second notch filter 790 having a second feedback stage 792 are coupled to the node 480. The notch filter 290a and the second notch filter 790 are configured to attenuate components of a radio frequency signal (e.g., the RF signal 297 of FIG. 2) received from an amplifier output (e.g., the output of the first LNA 240a). The notch filter 290a generates a low impedance at the node 480 for signal components at a first frequency TX_LO1 426, which may be a frequency of a first transmitter local oscillator of the wireless device 110 or another frequency, such as a first jammer frequency. The second notch filter 790 includes a mixer 722, an opamp 724, a second mixer 752, and a transconductance stage 764 and may operate in a substantially similar manner as the notch filter 290a. The second notch filter 790 is configured generate a low impedance at the node 480 to attenuate signal components at a second notch frequency TX_LO2 726, which may be a frequency of a second transmitter local oscillator of the wireless device 110 or another frequency, such as a second jammer frequency.

Although FIG. 7 depicts two notch filters 290a and 790 in the LNA block 294a, in other implementations three or more notch filters may be included in the LNA block 294a. For example, four notch filters may be included in the LNA block 294a to attenuate components of an RF signal at four different notch frequencies.

Figure 8:
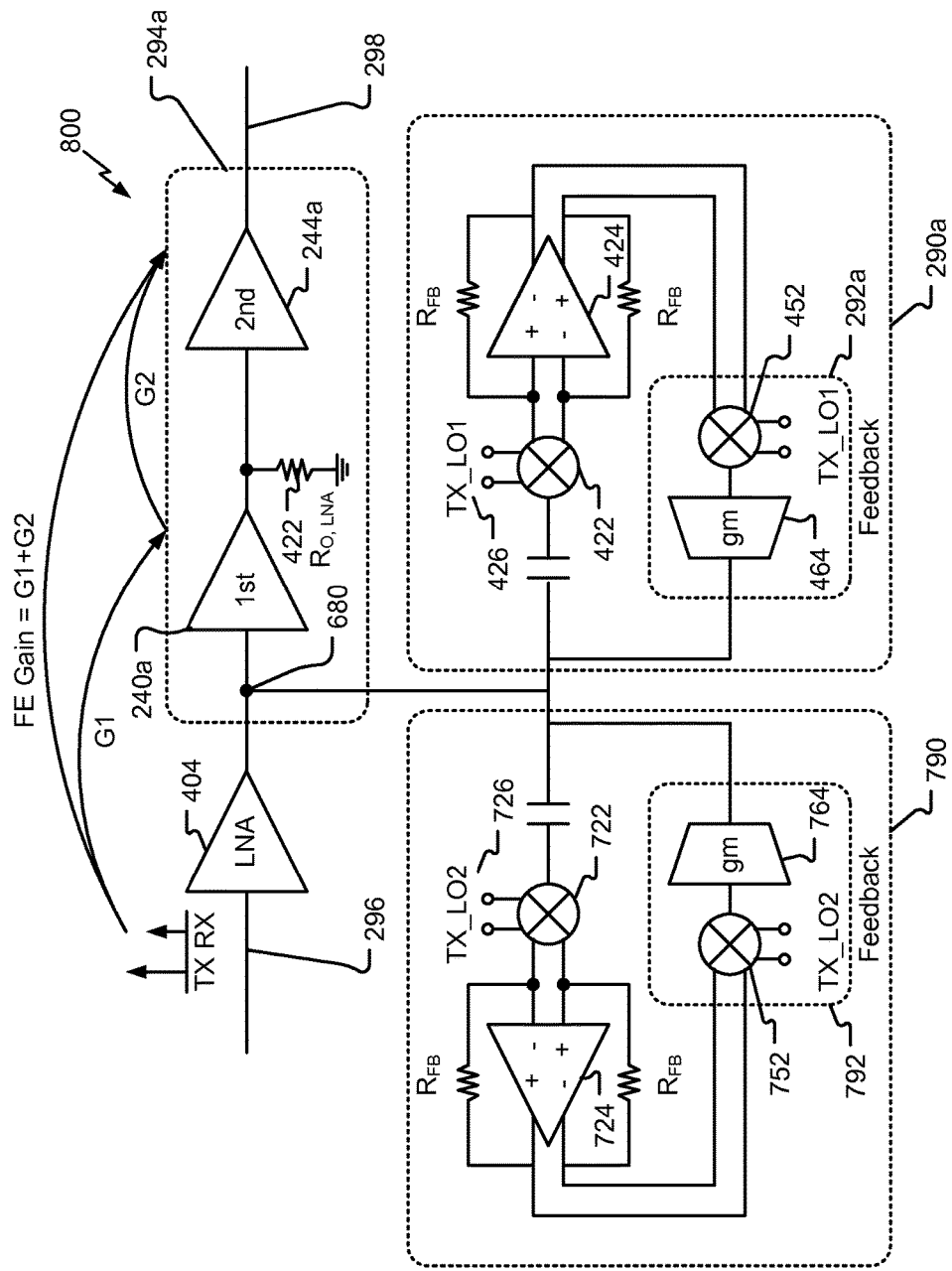
FIG. 8 shows a block diagram of another exemplary embodiment of components including multiple notch filters that may be included in the wireless device of FIG. 1.
Figure 9:
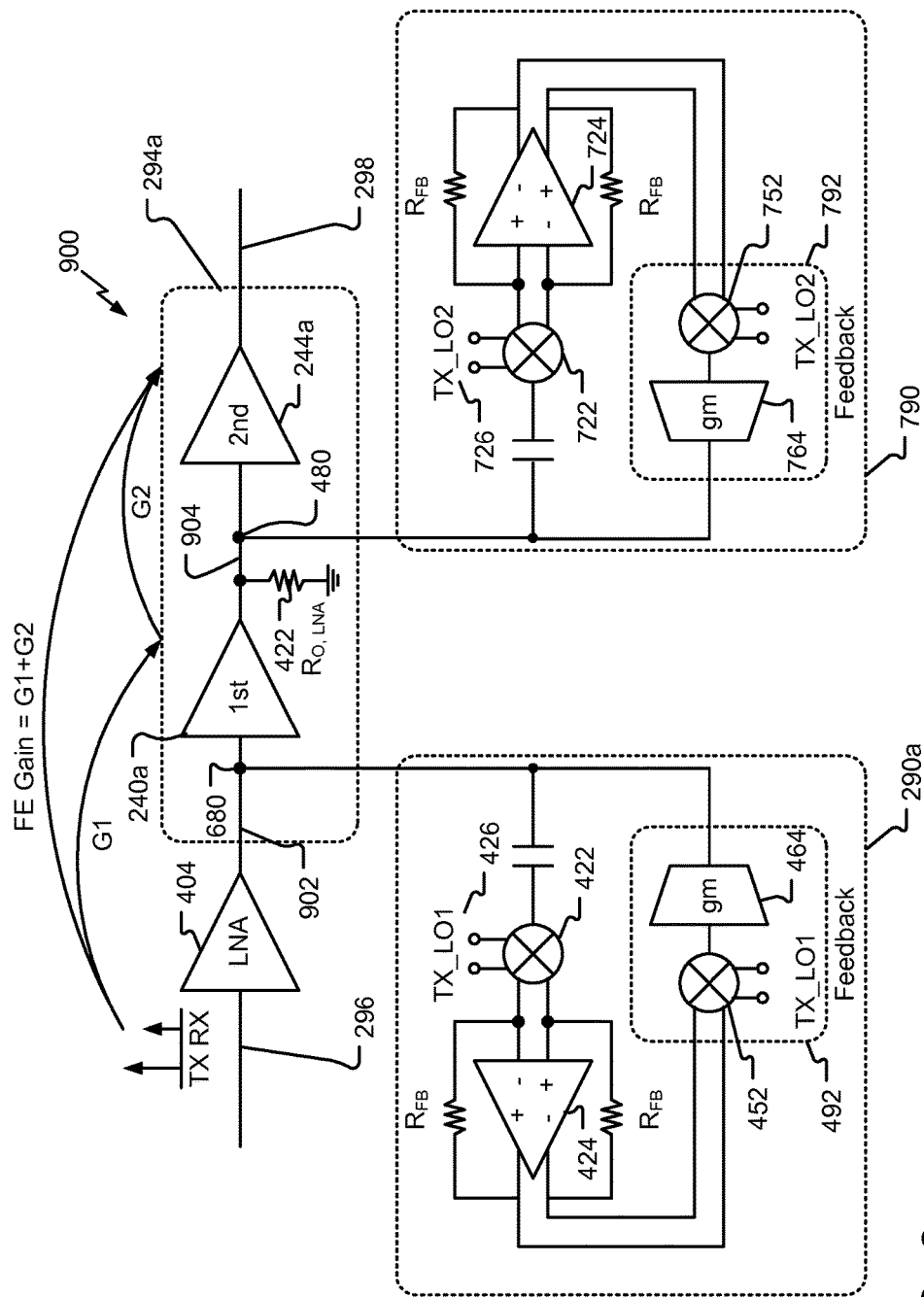
FIG. 9 shows a block diagram of another exemplary embodiment of components including multiple notch filters that may be included in the wireless device of FIG. 1.

In implementations that include multiple notch filters in the LNA block 294a, such as depicted in FIG. 7, one or more of the notch filters may be coupled to different nodes within the LNA block 294a than illustrated in FIG. 7. For example, FIG. 8 depicts an exemplary embodiment 800 in which the first notch filter 290a and the second notch filter 790 of FIG. 7 are coupled to the node 680 at the output of the LNA 404. As another example, FIG. 9 depicts an exemplary embodiment 900 in which the first notch filter 290a is coupled via the node 680 to the input of the first LNA 240a and the second notch filter 790 of FIG. 7 is coupled via the node 480 to the input of the second LNA 244a and to the output of the first LNA 240a, as an illustrative, non-limiting example. The first notch filter 290a is configured to attenuate a radio frequency signal 902 at a first notch frequency (e.g., TX_LO1), and the second notch filter 790 is configured to attenuate an output signal 904 of the first LNA 240a at a second notch frequency (e.g., TX_LO2). Although FIGS. 1-9 depict exemplary embodiments of notch filters in the context of the notch filter 290a coupled to an input of an LNA, such as the LNA 244a of FIG. 2, some or all of the others of the LNA blocks 294a to 294k and 295a to 295m may also include one or more notch filters that operate in a similar manner as the notch filter 290a in the LNA block 294a.

Figure 10:
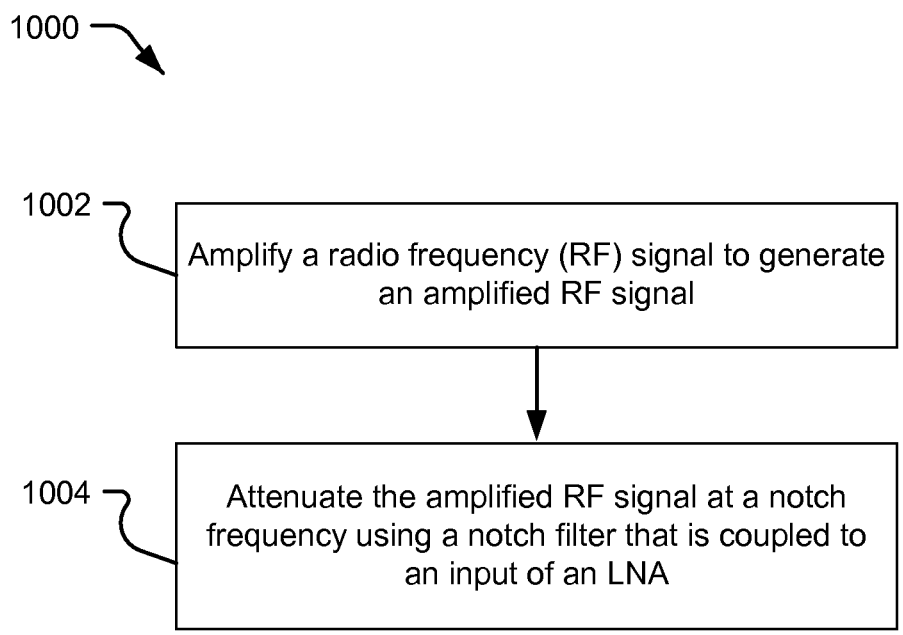
FIG. 10 illustrates a flowchart of a method that may be performed by the wireless device of FIG. 1.

An exemplary method 1000 that may be performed in the wireless device 110 of FIG. 1 is shown in FIG. 10. The method 1000 includes amplifying a radio frequency (RF) signal to generate an amplified RF signal, at 1002. For example, the LNA 240a may amplify an RF signal (e.g., the RF signal 296 of FIG. 2) that is received from the antenna 210 via the antenna interface circuit 224 of FIG. 2.

The method 1000 also includes attenuating the amplified RF signal at a notch frequency using a notch filter that is coupled to an input of an LNA, at 1004. Attenuating the amplified RF signal at the notch frequency includes attenuating components of the amplified RF signal that have the notch frequency without attenuating (or with reduced attenuation of) other components of the amplified RF signal having frequencies outside of the "notch" of the notch filter. Components of the amplified signal may be attenuated at the notch frequency at a high-impedance node in an amplifier block by providing a low impedance at the notch frequency. To illustrate, the amplified RF signal at the node 480 of FIG. 4, 5, 7, or 9 may be attenuated at the notch frequency by the notch filter 290a that may include the feedback stage 292a. By attenuating components of a received RF signal at the notch frequency, such as a transmitter leakage component or a jammer component, a sensitivity of a later amplifier (e.g., at the second LNA 244a) to a receive carrier signal may be enhanced. Increasing the sensitivity of the later amplifier (e.g. LNA 244a) to the receive carrier signal enables enhanced amplification of the receive carrier signal with reduced amplifier distortion.

In conjunction with the described embodiments, an apparatus may include means for amplifying a radio frequency signal. For example, the means for amplifying may correspond to one or more of the LNAs 240a to 240k or 241a to 241m of FIG. 2, one or more of the LNAs 244a to 244k or 245a to 245m of FIG. 2, the LNA 240a of FIGS. 4-9, the LNA 244a of FIGS. 4-9, one or more other devices, circuits, or any combination thereof.

The apparatus may include means for attenuating the radio frequency signal at a notch frequency. The means for attenuating is coupled to an input of the means for amplifying. For example, the means for attenuating may include one or more of the notch filters 290a to 290k or 291a to 291m of FIG. 2, the notch filter 290a of FIGS. 3-9, the notch filter 790 of FIGS. 7-9, one or more other devices, circuits, or any combination thereof.

The means for attenuating may include means for mixing the radio frequency signal and a transmit local oscillator signal, the transmit local oscillator signal having the notch frequency. For example, the means for mixing may include the mixer 422 of FIGS. 4-9, the mixer 722 of FIGS. 7-9, one or more other devices, circuits, or any combination thereof.

The means for attenuating may include means for generating a feedback signal. The means for generating a feedback signal may correspond to one or more of the feedback stages 292a to 292k or 293a to 293m of FIG. 2, the feedback stage 292a of FIG. 4 or FIGS. 6-9, the feedback stage 792 of FIGS. 7-9, one or more other devices, circuits, or any combination thereof. The means for generating the feedback signal may include a second means for mixing. For example, the second means for mixing may include the mixer 452 of FIG. 4 or FIGS. 6-9, the mixer 752 of FIGS. 7-9, one or more other devices, circuits, or any combination thereof.

The means for attenuating may include second means for amplifying coupled to an output of the means for mixing and further coupled to an input of the second means for mixing. The second means for amplifying may include the operational amplifier 424 of FIGS. 4-9, the operational amplifier 724 of FIGS. 7-9, one or more other devices, circuits, or any combination thereof.

The means for attenuating may be coupled via a high-impedance node to the means for amplifying. For example, the high-impedance node may include the node 480 of FIG. 4-5, 7, or 9, the node 680 of FIG. 6, 8, or 9, one or more other devices, circuits, or any combination thereof. The apparatus may also include means for capacitively coupling an input of the means for attenuating to the high-impedance node. For example, the means for capacitively coupling may correspond to the capacitor 428 of FIGS. 4-6, one or more other devices, circuits, or any combination thereof.

The apparatus may include a third means for amplifying having an output coupled to the means for amplifying. For example, the third means for amplifying may include one or more of the LNAs 240*a* to 240*k* and 241*a* to 241*m* of FIG. 2, the LNA 240*a* of FIGS. 4-9, the LNA 404 of FIGS. 4-9, one or more other devices, circuits, or any combination thereof.

The apparatus may include means for transmitting at a transmit frequency. The notch frequency may correspond to the transmit frequency. For example, the means for transmitting may correspond to one or more of the transmitters 250*a* to 250*k* or 251*a* to 251*m* of FIG. 2, one or more other devices, circuits, or any combination thereof.

By attenuating the RF signal at the notch frequency, undesired components may be reduced or removed from the RF signal during amplification. As a result, sensitivity of the means for amplifying to a receive carrier signal may be enhanced. Increasing the sensitivity of the means for amplifying to the receive carrier signal enables enhanced amplification of the receive carrier signal with reduced distortion.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
  a low noise amplifier (LNA) having an input configured to receive a radio frequency signal; and
  a notch filter coupled to the input of the LNA and configured to attenuate the radio frequency signal at a notch frequency, the notch filter comprising:
    a mixer; and
    a feedback stage comprising a second mixer coupled to a transconductance device.

2. The apparatus of claim 1, wherein the notch frequency corresponds to a transmit frequency.

3. The apparatus of claim 1, the notch filter further comprising an operational amplifier coupled to an output of the mixer and further coupled to an input of the second mixer.

4. The apparatus of claim 1, the notch filter comprising a single-port filter that is coupled to a high-impedance node and has a low impedance at the notch frequency.

5. The apparatus of claim 4, wherein an input of the notch filter is coupled to the high-impedance node via a capacitor.

6. The apparatus of claim 4, wherein an output of the feedback stage is coupled to the high-impedance node.

7. The apparatus of claim 1, further comprising a second notch filter coupled to the input of the LNA, the second notch filter configured to attenuate the radio frequency signal at a second notch frequency.

8. The apparatus of claim 1, wherein the LNA is a first LNA, and further comprising:
  a second LNA coupled to an output of the first LNA; and
  a second notch filter coupled to the input of the first LNA, the second notch filter configured to attenuate the radio frequency signal at a second notch frequency.

9. The apparatus of claim 1, wherein the LNA is a first LNA, and further comprising:
  a second LNA coupled to an output of the first LNA; and
  a second notch filter coupled to an input of the second LNA, the second notch filter configured to attenuate an output signal of the first LNA at a second notch frequency.

10. An apparatus comprising:
  means for amplifying a radio frequency signal; and
  means for attenuating the radio frequency signal at a notch frequency, the means for attenuating coupled to an input of the means for amplifying, the means for attenuating comprising means for mixing the radio frequency signal and a transmit local oscillator signal, the transmit local oscillator signal having the notch frequency.

11. The apparatus of claim 10, further comprising means for transmitting at a transmit frequency, wherein the notch frequency corresponds to the transmit frequency.

12. The apparatus of claim 10, the means for attenuating further comprising means for generating a feedback signal.

13. The apparatus of claim 12, the means for generating the feedback signal comprising a second means for mixing.

14. The apparatus of claim 13, the means for attenuating further comprising second means for amplifying coupled to an output of the means for mixing and further coupled to an input of the second means for mixing.

15. The apparatus of claim 10, the means for attenuating coupled via a high-impedance node to the means for amplifying.

16. A method comprising:
  amplifying a radio frequency (RF) signal to generate an amplified RF signal;
  attenuating the amplified RF signal at a notch frequency using a notch filter that is coupled to an input of a low noise amplifier (LNA); and
  mixing the RF signal and a transmit local oscillator signal, the transmit local oscillator signal having the notch frequency.

17. The method of claim 16, wherein the amplified RF signal is attenuated at the notch frequency at a high-impedance node.

18. An apparatus comprising:
  a low noise amplifier (LNA) having an input configured to receive a radio frequency signal;

a notch filter coupled to the input of the LNA and configured to attenuate the radio frequency signal at a notch frequency; and a second notch filter coupled to the input of the LNA, the second notch filter configured to attenuate the radio frequency signal at a second notch frequency.

19. The apparatus of claim 18, wherein the notch frequency corresponds to a transmit frequency.

20. An apparatus comprising:

a first low noise amplifier (LNA) having an input configured to receive a radio frequency signal;

a notch filter coupled to the input of the first LNA and configured to attenuate the radio frequency signal at a notch frequency;

a second LNA coupled to an output of the first LNA; and a second notch filter coupled to an input of the second LNA, the second notch filter configured to attenuate an output signal of the first LNA at a second notch frequency.

21. The apparatus of claim 20, wherein the notch frequency corresponds to a transmit frequency.

\* \* \* \* \*